United States Patent
Yamada et al.

[19]

[11] Patent Number: 6,121,690

[45] Date of Patent: Sep. 19, 2000

[54] SEMICONDUCTOR DEVICE HAVING TWO PLURALITIES OF ELECTRODE PADS, PADS OF DIFFERENT PLURALITIES HAVING DIFFERENT WIDTHS AND RESPECTIVE PADS OF DIFFERENT PLURALITIES HAVING AN ALIGNED TRANSVERSE EDGE

[75] Inventors: Shigeru Yamada; Youichi Kohara, both of Tokyo, Japan

[73] Assignee: Oki Electric Industry Co., Ltd., Tokyo, Japan

[21] Appl. No.: 09/110,965

[22] Filed: Jul. 7, 1998

[30] Foreign Application Priority Data

Jul. 25, 1997 [JP] Japan .................................. 9-215666

[51] Int. Cl.$^7$ .................................................. H01L 23/48
[52] U.S. Cl. .................... 257/784; 257/786; 257/780; 257/773; 257/734; 257/203; 257/207
[58] Field of Search ..................................... 257/786, 784, 257/776, 773, 780, 781, 630, 631, 633, 638, 734, 203, 207

[56] References Cited

U.S. PATENT DOCUMENTS

| | | | |
|---|---|---|---|
| 5,468,999 | 11/1995 | Lin et al. ................................. | 257/784 |
| 5,569,964 | 10/1996 | Ikebe ....................................... | 257/780 |

FOREIGN PATENT DOCUMENTS

| | | |
|---|---|---|
| 4-269856 | 9/1992 | Japan . |
| 6-53413 | 2/1994 | Japan . |

*Primary Examiner*—Sara Crane
*Assistant Examiner*—Luan Thai
*Attorney, Agent, or Firm*—Jones Volentine, L.L.P.

[57] ABSTRACT

In order to solve the aforementioned problems, a semiconductor device according to the present invention comprises a semiconductor chip, a plurality of first electrode pads respectively placed along a peripheral edge portion of the semiconductor chip and having first and second transverse ends, and a plurality of second electrode pads respectively having transverse ends near from center lines of the semiconductor chip, the transverse ends being respectively placed at the same distances from the center lines as the first transverse ends of the first electrode pads along the peripheral edge portion of the semiconductor chip, and having widths broader than those of the first electrode pads.

The width of each second electrode pad is formed to 1.5 to 2 times as long as that of each first electrode pad.

Wires for electrically connecting the first and second electrode pads and leads are formed so as to be bonded at substantially the same intervals.

The heights of the wires are formed so as to be substantially identical to each other.

10 Claims, 5 Drawing Sheets

SEMICONDUCTOR DEVICE HAVING TWO PLURALITIES OF ELECTRODE PADS, PADS OF DIFFERENT PLURALITIES HAVING DIFFERENT WIDTHS AND RESPECTIVE PADS OF DIFFERENT PLURALITIES HAVING AN ALIGNED TRANSVERSE EDGE

BACKGROUND OF THE INVENTION

1. Field of the Invention

This invention relates to a semiconductor device capable of adjusting the intervals between wires for electrically connecting pads and leads and particularly avoiding electrical contacts between the wires at the corners of the semiconductor device.

2. Description of the Related Art

A wire-bonding method for electrically connecting pads and leads provided within a semiconductor device by using micro-fabricated conductors or wires is known in the fabrication of a semiconductor apparatus or unit. Since the wire-bonding method is easy to connect them and provides high reliability, it is now widespread. In recent years, the degree of integration of the semiconductor device has greatly increased to realize high added values. With its increase, a so-called multi-pin configuration is now in progress, and the numbers of pads and leads and the number of conductors or wires for electrically connecting them increase. Wire-bonding needs to electrically connect several tens to a few hundred of pads arranged along the periphery of a semiconductor device having four sides given in a few millimeters, for example and leads by wires respectively and avoid an electrical short circuit and a failure in operation due to electrical contacts between the respective wires.

Japanese Patent Application Laid-Open No. Hei 4-269856 has heretofore been disclosed firstly as a technique that meets such a demand. Namely, the semiconductor device disclosed therein takes such a configuration that inner pads and outer pads are arranged in two rows in zigzags along the periphery of the semiconductor device to provide the large number of pads along the periphery of the semiconductor device. In the semiconductor device, the inner pads and the outer pads have substantially the same sizes and are alternately placed half-pitch apart.

Further, Japanese Patent Application Laid-Open No. Hei 6-53413 has also heretofore been disclosed as a technique which meets such a demand. Namely, the semiconductor device disclosed herein takes a configuration in which inner pads and outer pads are arranged in two rows in zigzags along the periphery of the semiconductor device. In the semiconductor device, any of the inner and outer pats is shaped in square form but they are different in size from one another. In the example disclosed in the present patent publication, the outer pads are greater than the inner pads in size. The outer large pads are used upon wire bonding and both the inner and outer pads are used upon Tape Automated Bonding to provide an improvement in general versatility.

However, as in the case of the semiconductor device disclosed in Japanese Patent Application Laid-Open No. Hei 4-269856, the height of the semiconductor device becomes inevitably high when the wires for electrically connecting the inner pads and the leads and the wires for electrically connecting the outer pads and the leads are made different in height from each other. Therefore, the present semiconductor device cannot be applied to a thin package that will be mainstream. In the present semiconductor device as well, the adjoining wires become substantially parallel at portions or areas near the center line of the semiconductor device but are inclined as they approach the corner of the semiconductor device, thereby causing a greater overlap with each other. Therefore, the semiconductor device is easy to cause an electrical failure and an assembly failure incident to its failure. Further, a check or the like for the semiconductor device falls into difficulties. The leads must be specifically designed, thereby increasing their development costs.

In the semiconductor device disclosed in Japanese Patent Application Laid-Open No. Hei 6-53413, the wire-bonding pads are outwardly disposed in only one row and respectively shaped in the form of a considerable large square. Accordingly, the semiconductor device cannot meet the recent multi-pin configuration.

Thus, there has been a demand for the provision of a semiconductor device capable of adjusting the intervals between adjacent wires for electrically connecting pads and leads and particularly avoiding electrical contacts between the wires at the corners of the semiconductor device.

SUMMARY OF THE INVENTION

With the foregoing in view, it is therefore an object of the present invention to provide a semiconductor device capable of adjusting the intervals between adjacent wires for electrically connecting electrode pads and leads and particularly avoiding electrical contacts between the wires which adjoin each other at the corners of the semiconductor chip.

According to one aspect of this invention, for achieving the above object, there is provided a semiconductor device, comprising:

a semiconductor chip;

a plurality of first electrode pads respectively placed along a peripheral edge portion of the semiconductor chip and having first and second transverse ends; and a plurality of second electrode pads respectively having transverse ends near from center lines of the semiconductor chip, the transverse ends being respectively placed at the same distances from the center lines as the first transverse ends of the first electrode pads along the peripheral edge portion of the semiconductor chip, and having widths broader than those of the first electrode pads.

The width of each second electrode pad is formed to 1.5 to 2 times as long as that of each first electrode pad.

Wires for electrically connecting the first and second electrode pads and leads are formed so as to be bonded at substantially the same intervals.

The heights of the wires are formed so as to be substantially identical to each other.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
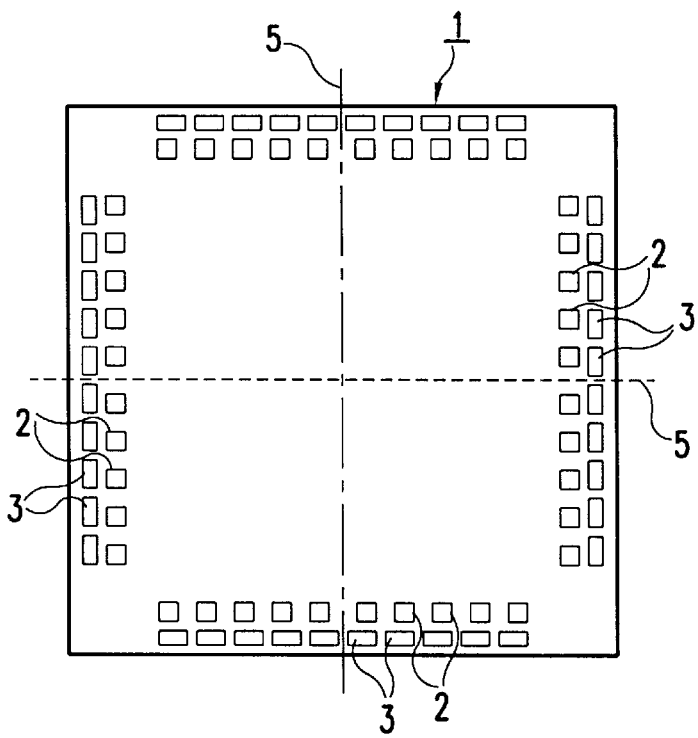
FIG. 1 is a plan view of a semiconductor device according to a first embodiment of the present invention.
Figure 2:
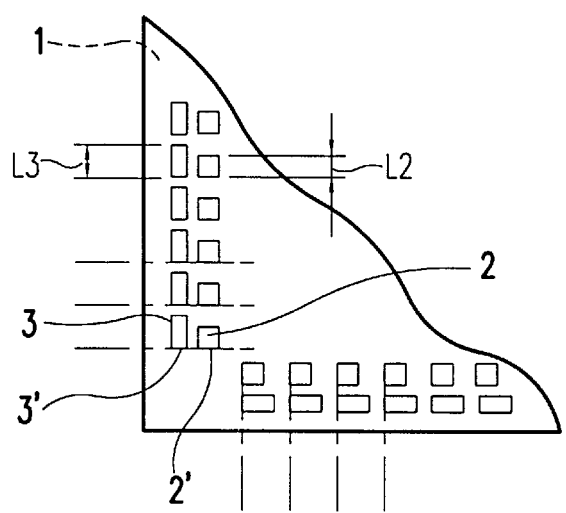
FIG. 2 is a partial view showing, in an developed form, a part of the semiconductor device shown in FIG. 1.

Preferred embodiments of the present invention will hereinafter be described with reference to the accompanying drawings. FIG. 1 is a plan view showing a semiconductor device 1 according to a first embodiment of the present invention. FIG. 2 is a partial view illustrating some of the semiconductor device 1 in an enlarged form.

Pads 2 and 3 are respectively arranged on the surface of the semiconductor device 1 in two rows along the periphery of the semiconductor device 1. Although not shown in the drawing, an electronic circuit such as an LSI or the like is incorporated into the semiconductor device 1 and configured so that signals are inputted thereto and outputted therefrom through these pads 2 and 3. In the illustrated embodiment, any of the inwardly arranged pads 2 is shaped in the form of a square. On the other hand, any of the pads 3 arranged outside the pads 2 is shaped in the form of a rectangle. In the first embodiment, the transverse width $L_3$ of each outwardly arranged pad 3 is set to 1.5 to 2 times as long as the transverse width $L_2$ of each inwardly arranged pad 2 as shown in FIG. 2.

In the first embodiment as well, the inwardly arranged pads 2 and the outwardly arranged pads 3 are all arranged so as to be symmetrical about center lines 5 of the semiconductor device 1 shown in FIG. 1 from side to side. As shown in FIG. 2, the respective pads 2 and 3 are disposed in such a manner that outer sides 2' of the inwardly square-shaped pads 2 with respect to the center lines 5 and outer sides 3' of the outwardly rectangle-shaped pads 3 with respect to the center lines 5 take the same distances from the center lines 5, respectively.

Figure 3:
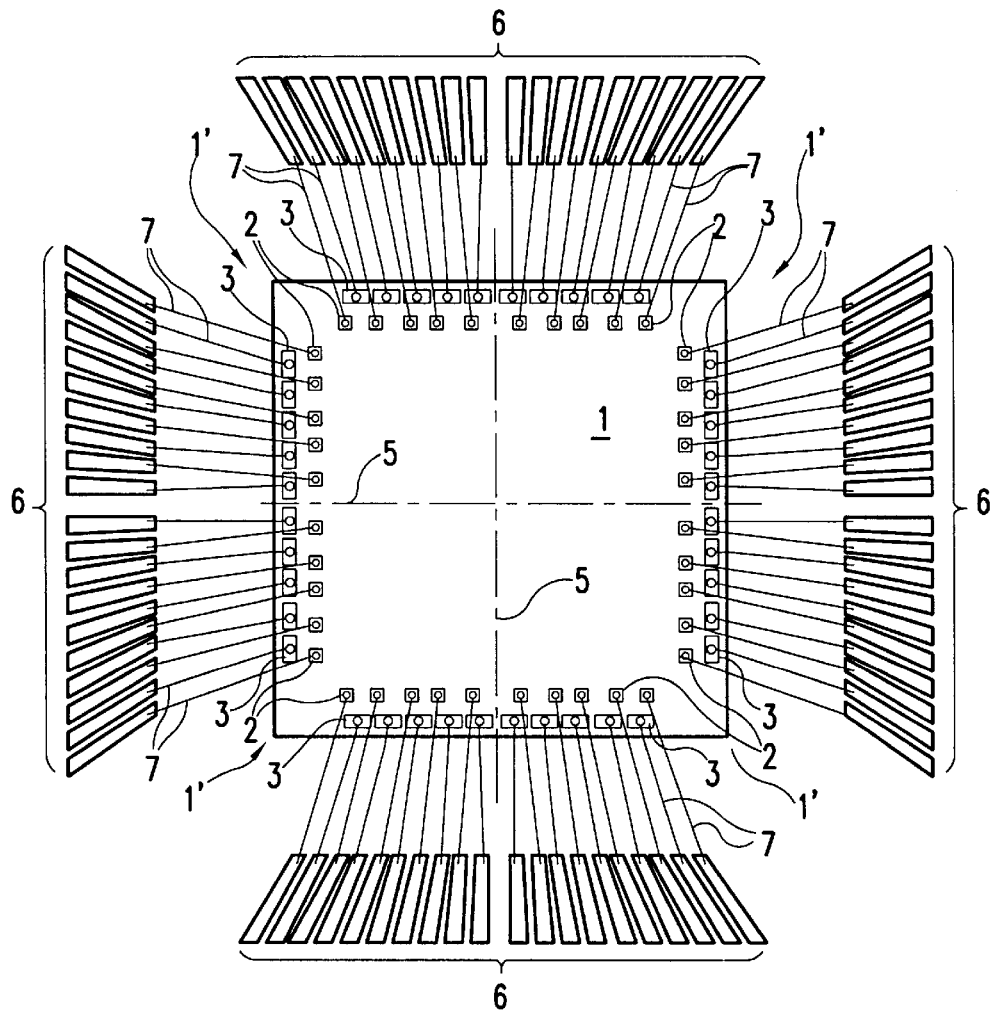
FIG. 3 is a view for describing a semiconductor unit fabricated by the semiconductor device shown in FIG. 1.
Figure 4:
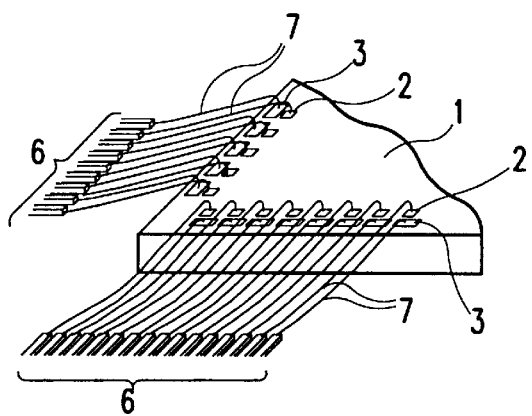
FIG. 4 is an enlarged view of wires.

When the semiconductor device 1 is used to assemble a semiconductor apparatus or unit, leads 6 are placed around the semiconductor device 1 and the respective pads 2 and 3 and leads 6 are respectively electrically connected to one another by conductors or wires 7 such as gold wires or the like as shown in FIG. 3. With respect to the inwardly arranged pads 2 in this case, the wires 7 are basically electrically connected to the centers of the pads 2 respectively. With respect to the outwardly arranged pads 3 on the other hand, the wires 7 are respectively electrically connected to positions of the rectangle-shaped pads 3 near the center lines 5 in portions or areas near the center lines 5 of the semiconductor device 1. At the corners 1' of the semiconductor device 1, the wires 7 are respectively electrically connected to positions of the rectangle-shaped pads 3 away from the center lines 5. If done in this way, then the intervals between the respective wires 7 can be set as equally as possible even in either case of the areas near the center lines 5 of the semiconductor device 1 and the corners 1' thereof.

According to the semiconductor device 1 showing the first embodiment, since the outwardly arranged pads 3 are rectangular in shape, the wires 7 can be electrically connected to arbitrary positions. Further, since the intervals between the adjacent wires 7 are set as equally as possible, there are no electrical contacts between the wires 7 and the assembly of the semiconductor unit becomes easy. If the pads 3 are rectangular in shape, then wire bonding is easy to do.

According to the semiconductor device 1 showing the first embodiment as well, since the intervals between the wires 7 can be set as equally as possible, there is no possibility that the wires 7 will contact with each other even if the wires 7 connecting the inwardly arranged pads 2 and the leads 6 are set identical to the wires 7 connecting the outwardly arranged pads 3 and the leads 6 in height. Owing to the placement of all the wires 7 at the same height in this way, a thin type semiconductor unit can be manufactured. It is therefore possible to easily fabricate thin semiconductor apparatus or units such as a TQFP (Thin Quad Flatpack Package), an LQFP (Low-profile Quad Flatpack Package), etc.

Figure 5:
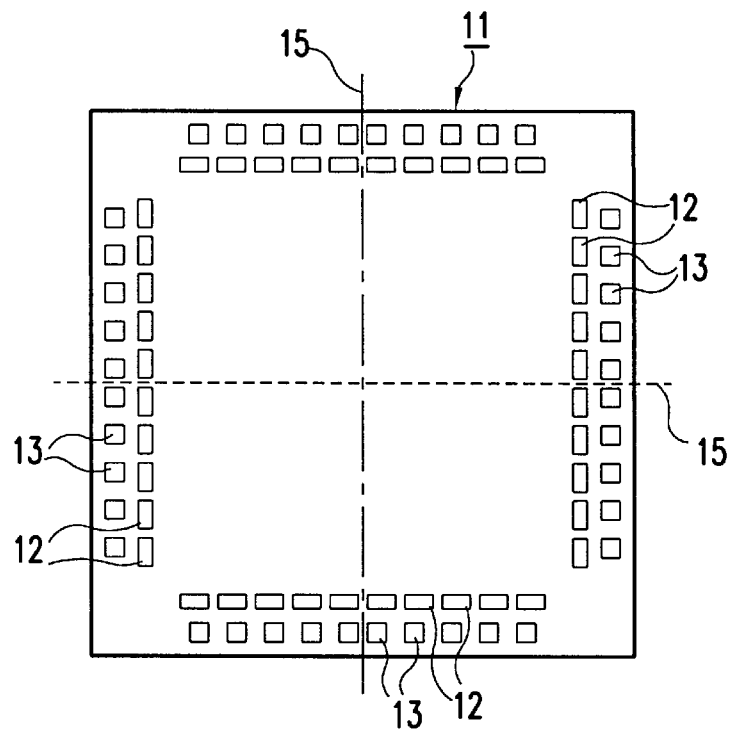
FIG. 5 is a plan view of a semiconductor device according to a second embodiment of the present invention.
Figure 6:
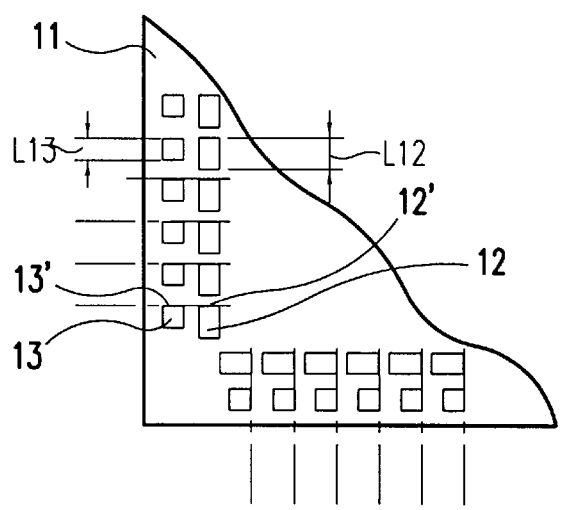
FIG. 6 is a partial view illustrating, in an enlarged view, a part of the semiconductor device shown in FIG. 5.

Next, FIG. 5 is a plan view of a semiconductor device 11 according to a second embodiment of the present invention. FIG. 6 is a partial view showing some of the semiconductor device 11 in an enlarged form. Pads 12 and 13 are respectively placed even on the surface of the semiconductor device 11 along the periphery of the semiconductor device 11 in two rows. Similarly to the above, an electronic circuit such as an LSI or the like is incorporated into the semiconductor device 11 and configured so that signals are inputted thereto and outputted therefrom through these pads 12 and 13. In the illustrated embodiment, any of the inwardly arranged pads 12 is shaped in the form of a rectangle. On the other hand, any of the outwardly arranged pads 13 is shaped in the form of a square. In the second embodiment, the transverse width $L_{12}$ of each inwardly arranged pad 12 is set to 1.5 to 2 times as long as the transverse width $L_{13}$ of each outwardly arranged pad 13 as shown in FIG. 6.

Further, even in the second embodiment, the inwardly arranged pads 12 and the outwardly arranged pads 3 are all arranged so as to be symmetrical about center lines 15 of the semiconductor device 11 shown in FIG. 5 from side to side. As shown in FIG. 6, the respective pads 12 and 13 are disposed in such a manner that inner sides 12' of the inwardly rectangle-shaped pads 12 with respect to the center lines 15 and outer sides 13' of the outwardly square-shaped pads 13 with respect to the center lines 15 take the same distances from the center lines 15, respectively.

According to the semiconductor device 11 showing the second embodiment, conductors or wires can be electrically connected to arbitrary positions of the inwardly arranged rectangular pads 12. Owing to the setting of the intervals between the wires connected to the respective pads 12 and 13 as equally as possible, electrical contacts between the wires can be brought to nothing and hence the assembly of a semiconductor package or unit becomes easy. Thus, a thin semiconductor unit can be fabricated in a manner similar to the semiconductor device 1 according to the previously-described first embodiment. Therefore, thin semiconductor units or packages such as a TQFP, an LQFP, etc. can be easily manufactured.

Figure 7:
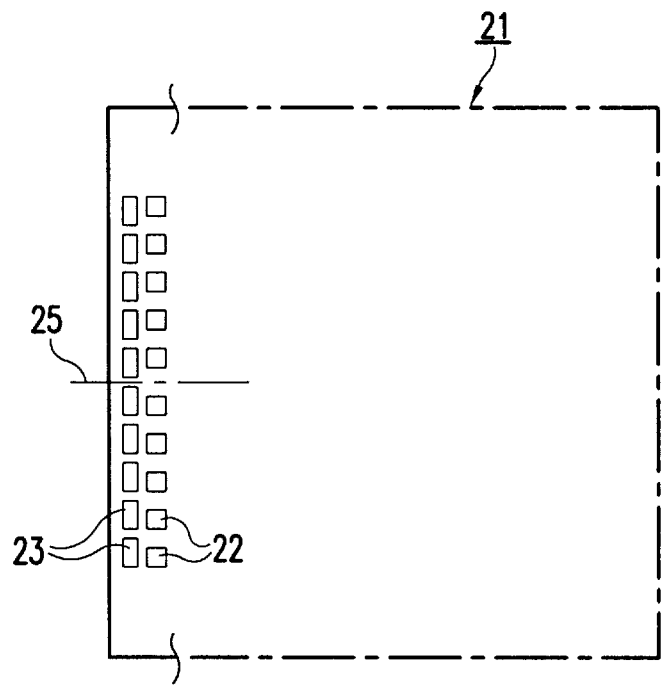
FIG. 7 is a plan view of a further embodiment of the present invention.
Figure 8:
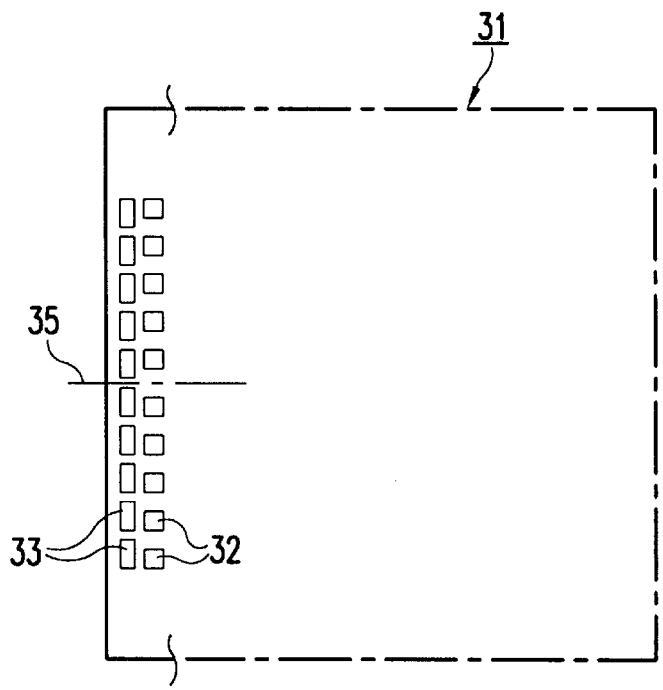
FIG. 8 is a plan view of a still further embodiment of the present invention.
Figure 9:
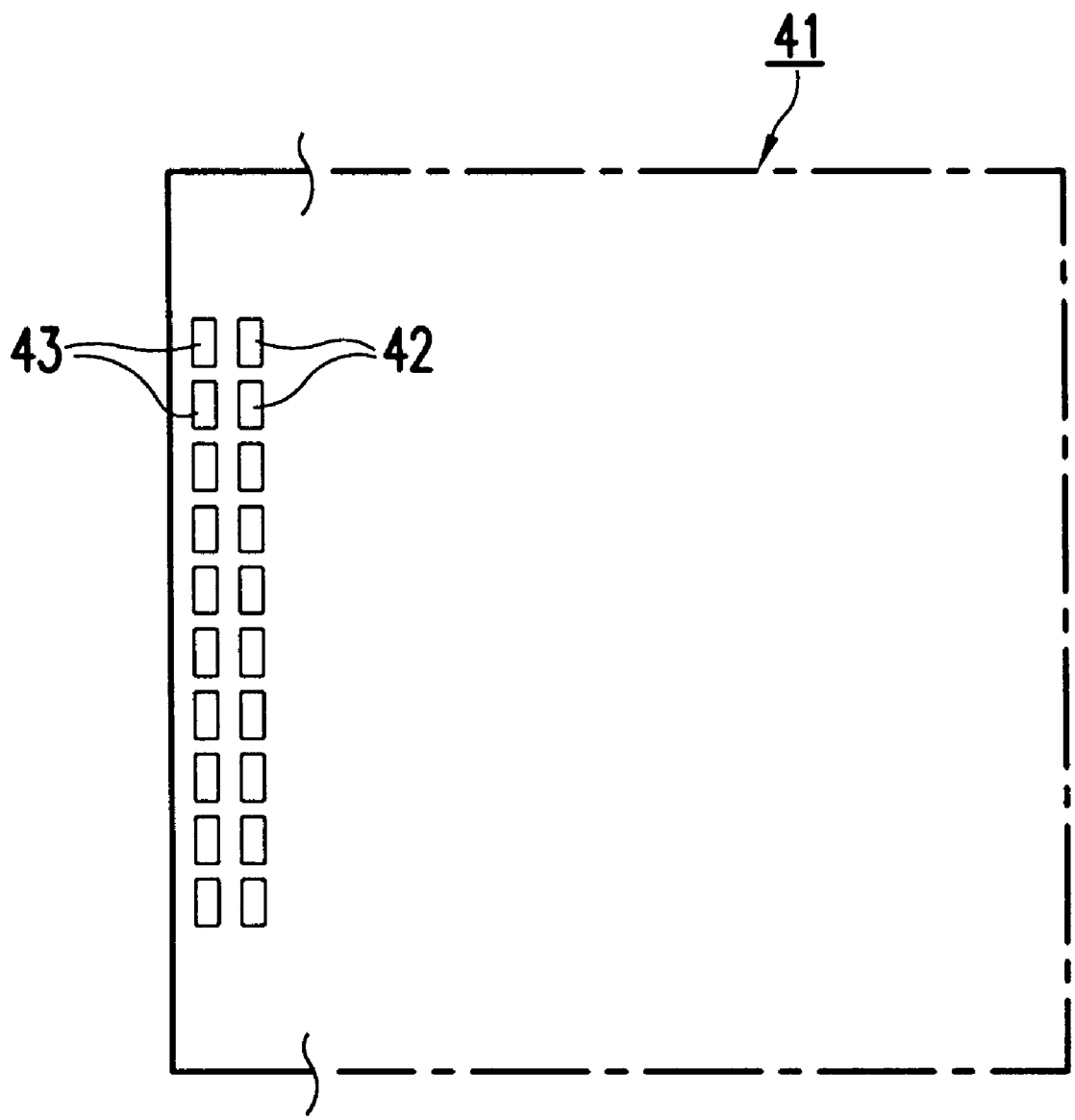
FIG. 9 is a plan view of a still further embodiment of the present invention.

While the preferred embodiments of the present invention have been described above with reference to the accompanying drawings, the present invention is not limited to the embodiments described above. It will be apparent to those skilled in the art that various changes or modifications of the illustrative embodiments can be contemplated within the scope of the technical idea defined in the appended claims. It can be understood that they should belong to the technical scope of the invention. As shown in FIG. 7, for example, inwardly arranged pads 22 and outwardly arranged pads 23 may not be placed so as to be symmetrical about a center line 25 of a semiconductor device 21 from side to side. As in the case of a semiconductor device 31 shown in FIG. 8, square-shaped inner pads 32 and rectangle-shaped outer pads 33 may be disposed so that the center positions of the pads 33 and the center positions of the pads 33 take the same distances from a center line 35 respectively. Only either one of the inner and outer pads may take a flat shape long from side to side along the periphery of the semiconductor device. As an alternative, however, both inner and outer pads 42 and 43 may be shaped in the form of a rectangle as in the case of a semiconductor device 41 shown in FIG. 9, for example. The pads are not necessarily limited to the rectangle in shape and may be shaped in the form of an ellipse, a polygon or the like. Further, the arrangement of the pads is not limited to two rows and the pads may be placed in three or more rows along the periphery of the semiconductor device.

According to a semiconductor device of the present invention, since the intervals between adjacent wires electrically connected to pads can be adjusted to substantially equal intervals, there are no electrical contacts between the wires and a semiconductor package or unit is easy to assemble. The placement of the wires at the same height allows fabrication of a thin semiconductor unit. Therefore, thin semiconductor units such as a TQFP, an LQFP, etc. can be easily manufactured.

What is claimed is:

1. A semiconductor device, comprising:

a semiconductor chip;

a plurality of first electrode pads respectively placed along a peripheral edge portion of said semiconductor chip, each first electrode pad of the plurality of first electrode pads having first and second transverse ends, with first transverse ends being closer to center lines of said semiconductor chip than second transverse ends; and a plurality of second electrode pads respectively having first and second transverse ends with first transverse ends being closer to center lines of said semiconductor chip than second transverse ends, said first transverse ends of the plurality of second electrode pads being respectively placed at the same distances from the center lines as the first transverse ends of said first electrode pads along the peripheral edge portion of said semiconductor chip, and having widths broader than those of said first electrode pads.

2. The device of claim 1, wherein the width of said each second electrode pad is formed to 1.5 to 2 times as long as that of said each first electrode pad.

3. The device of claim 2, wherein wires for electrically connecting said first and second electrode pads and leads are bonded at substantially the same intervals.

4. The device of claim 1, wherein wires for electrically connecting said first and second electrode pads and leads are bonded at substantially the same intervals.

5. The device of claim 4, wherein the heights of the wires are formed so as to be substantially identical to each other.

6. A semiconductor device, comprising:

a semiconductor chip;

a plurality of first electrode pads respectively placed along a peripheral edge portion of said semiconductor chip, each first electrode pad of the plurality of first electrode pads having first and second transverse ends, with second transverse ends being further from center lines of said semiconductor chip than first transverse ends; and a plurality of second electrode pads respectively having first and second transverse ends with second transverse ends being further from center lines of said semiconductor chip than first transverse ends, said second transverse ends of the plurality of second electrode pads being respectively placed at the same distances from the center lines as the second transverse ends of said first electrode pads along the peripheral edge portion of said semiconductor chip, and having widths broader than those of said first electrode pads.

7. The device of claim 6, wherein the width of said each second electrode pad is formed to 1.5 to 2 times as long as that of said each first electrode pad.

8. The device of claim 7, wherein wires for electrically connecting said first and second electrode pads and leads are bonded at substantially the same intervals.

9. The device of claim 6, wherein wires for electrically connecting said first and second electrode pads and leads are bonded at substantially the same intervals.

10. The device of claim 9, wherein the heights of the wires are formed so as to be substantially identical to each other.

* * * * *